United States Patent
Park et al.

(10) Patent No.: US 11,414,434 B2
(45) Date of Patent: Aug. 16, 2022

(54) RARE EARTH PRECURSOR, METHOD OF MANUFACTURING SAME AND METHOD OF FORMING THIN FILM USING SAME

(71) Applicant: HANSOL CHEMICAL CO., LTD., Seoul (KR)

(72) Inventors: Jung-Woo Park, Seoul (KR); Jang-Hyeon Seok, Sejong-si (KR); Hyo-Suk Kim, Jeollabuk-do (KR); Eun-Jeong Cho, Gwangju (KR)

(73) Assignee: HANSOL CHEMICAL CO., LTD., Seoul (KR)

( * ) Notice: Subject to any disclaimer, the term of this patent is extended or adjusted under 35 U.S.C. 154(b) by 388 days.

(21) Appl. No.: 16/627,241

(22) PCT Filed: Dec. 27, 2018

(86) PCT No.: PCT/KR2018/016740
§ 371 (c)(1),
(2) Date: Dec. 27, 2019

(87) PCT Pub. No.: WO2020/130216
PCT Pub. Date: Jun. 25, 2020

(65) Prior Publication Data
US 2022/0144861 A1 May 12, 2022

(30) Foreign Application Priority Data
Dec. 19, 2018 (KR) .......................... 10-2018-0165384

(51) Int. Cl.
*C07F 5/00* (2006.01)
*C23C 16/18* (2006.01)

(52) U.S. Cl.
CPC .............. *C07F 5/003* (2013.01); *C23C 16/18* (2013.01)

(58) Field of Classification Search
None
See application file for complete search history.

(56) References Cited

U.S. PATENT DOCUMENTS

2007/0122947 A1* 5/2007 Sakurai .................. C23C 16/18
438/572
2018/0187303 A1* 7/2018 Gatineau ........... C23C 16/45553

FOREIGN PATENT DOCUMENTS

| JP | 2003040150 A | 2/2003 |
| JP | 2010151430 A | 7/2010 |
| JP | 201822608 A | 8/2018 |
| KR | 10-2011-0014179 A | 9/2016 |

OTHER PUBLICATIONS

Park, In-Sung, et al., "Atomic layer deposition of Y2)3 films using heteroleptic liquid (iPrCp)2Y(iPr-amd) precursor", Journal of Materials Chemistry C, 2014.
Seppala, S., et al., "Heteroleptic cycopentadienyl-amidinate precursors for ALD of Y, Pr, Gd and Dy oxide thin films", Chemistry of Materials, 2016.
Lee, Jae-Seung, et al., "Atomic layer deposition of Y2O3 and yttrium-doped HfO2 using a newly synthesized Y(iPrCp)2 (N-iPr-amd) precursor for a high permittivity gate dielectric", Applied Surface Science, 2014.
P.-F. Hsu et al., "Self-Reducible CuII Source Reagents for the CVD of Cooper," Chemical Vapor Deposition, vol. 7, No. 1, pp. 28-31 (2001).

* cited by examiner

*Primary Examiner* — Clinton A Brooks
(74) *Attorney, Agent, or Firm* — Venable LLP

(57) ABSTRACT

The present invention relates to a compound that is capable of being used in thin-film deposition using vapor deposition. Particularly, the present invention relates to a rare earth compound, which is capable of being applied to atomic layer deposition (ALD) or chemical vapor deposition (CVD) and which has excellent thermal stability and reactivity, a rare earth precursor including the same, a method of manufacturing the same, and a method of forming a thin film using the same.

9 Claims, No Drawings

RARE EARTH PRECURSOR, METHOD OF MANUFACTURING SAME AND METHOD OF FORMING THIN FILM USING SAME

The present application is a national-stage entry under 35 U.S.C. § 371 of International Patent Application No. PCT/KR2018/016740, filed Dec. 27, 2018, which claims priority to Korean Patent Application No. 10-2018-0165384, filed Dec. 19, 2018, the entire disclosure of each of which is incorporated by reference herein.

TECHNICAL FIELD

The present invention relates to a vapor deposition compound that is capable of being used in thin-film deposition using vapor deposition. Particularly, the present invention relates to a rare earth precursor, which is capable of being applied to atomic layer deposition (ALD) or chemical vapor deposition (CVD) and which has excellent volatility and thermal stability and a low melting point, a method of manufacturing the same, and a method of forming a thin film using the same.

BACKGROUND ART

In recent decades, silicon dioxide ($SiO_2$) has been a reliable dielectric. However, as semiconductor devices are becoming more densely packed and channel paths thereof are becoming finer, silicon dioxide is being replaced by a "metal gate/high-k" transistor, and the reliability of a $SiO_2$-based gate dielectric is reaching the physical limits thereof. In particular, there is a need to develop a new gate dielectric material for a dynamic random access memory (DRAM) memory device and a capacitor.

As the size of the device reaches the 20 nm level, there is increasing demand for materials having high dielectric constants and processes therefor. Preferably, high-k materials must have a high band gap and band offset, a high k value, excellent stability with respect to a silicon phase, a minimal $SiO_2$ interfacial layer, and a high-quality interface on a substrate. Further, preferred are amorphous or high-crystalline-temperature films.

In particular, materials containing rare earth elements are high-k dielectric materials useful for advanced silicon CMOS, germanium CMOS, and III-V transistor devices, and it is reported that new-generation oxides based on the high-k dielectric materials have significant advantages in terms of capacity compared to typical dielectric materials.

Further, materials containing rare earth elements are expected to be applied to the manufacture of perovskite materials having properties such as ferroelectricity, pyroelectricity, piezoelectricity, and resistance conversion.

Rare earth elements include Sc (scandium), Y (yttrium), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

Nevertheless, it is difficult to deposit rare-earth-containing layers, so new materials and processes are increasingly needed. With respect thereto, rare earth precursors having various ligands have been studied.

Representative examples of the ligands constituting the rare earth precursors include a group of compounds of beta-diketonate and cyclopentadienyl electrons. These precursors have excellent thermal stability, but the melting point thereof exceeds 90° C. Accordingly, since the deposition temperature range is high and the reactivity is relatively low, the precursors are not practical.

Lanthanum-2,2,6,6-tetramethylheptanedionate ([La(tmhd)$_3$]) has a high melting point of 260° C. or higher and rare-earth-2,2,7-trimethyloctanedionate ([La(tmod)$_3$]) has a melting point of 197° C. Further, the transfer efficiency of beta-diketonate is very difficult to control, the growth rate of a thin film is low, and the generation rate of carbon impurities is high, and thus the purity of the thin film is low.

Also, an unsubstituted cyclopentadienyl (Cp) compound exhibits a high melting point and a low volatility. A molecular design may help to improve volatility and reduce a melting point, but has been found to have limited usefulness under processing conditions. For example, La(iPrCp)$_3$ (iPr is isopropyl) is not suitable for ALD processes at temperatures of more than 225° C.

In addition, an alkoxide-based ligand has low volatility, and RE(NR$_2$)$_3$ (RE is a rare earth element), which is an amide-based ligand, is not suitable for ALD or CVD processes due to the structural instability of the compound.

Further, some currently available rare-earth-containing precursors exhibit many problems when used during a deposition process. For example, fluorinated rare earth precursors may generate LnF$_3$ as a byproduct. This byproduct is known to be difficult to remove.

That is, conventional rare earth precursors have a drawback in that the precursors are not thermally stable at high temperatures and thus have a low deposition rate in chemical vapor deposition (CVD) and atomic layer deposition (ALD) processes.

As a result, there is a need to develop alternative precursors for the deposition of rare-earth-containing films.

SUMMARY OF THE INVENTION

The present invention has been made keeping in mind the above problems with the conventional rare earth precursor, and an object of the present invention is to provide a rare-earth-precursor compound for thin-film deposition having excellent thermal stability and volatility and a low melting point.

The present invention also provides a method of manufacturing a thin film using the rare-earth-precursor compound.

However, the tasks to be solved by the present application are not limited to the above-mentioned tasks, and other tasks that are not mentioned will be clearly understood by those skilled in the art from the following description.

DETAILED DESCRIPTION

In order to solve the problems with the rare earth precursors as mentioned above, studies on various ligands have been conducted. However, a homoleptic-rare-earth precursor, in which all types of precursor ligands are the same as each other, still has the same problems. Further, the newly-introduced heteroleptic compound Y(iPr-Cp)$_2$ (iPr-amd) is present in a liquid state at room temperature and has the merits of thermal stability and volatility. However, there are drawbacks in that the deposition temperature range thereof is limited during thin-film deposition and in that the purity of the thin film or the growth rate is low compared to the case of using Y(iPr-Cp)$_3$ or Y(iPr-amd)$_3$.

In order to solve the above problems, therefore, the present inventors synthesized a heteroleptic-rare-earth precursor, in which not all types of ligands of the precursor are the same as each other and two or more types of ligands are contained, so as to manufacture a compound that is capable of maintaining the merits and overcoming the drawbacks of Y(iPr-Cp)$_2$ (iPr-amd) as a heteroleptic compound.

In particular, the present inventors combined a ligand having a substituted cyclopentadienyl (Cp) skeleton with a ligand that is capable of imparting a chelating effect, thereby synthesizing a novel rare earth precursor.

Thereby, it is possible to obtain a novel rare earth precursor having excellent volatility and thermal stability and a low melting point, compared to the previously known lanthanum precursor compound.

An aspect of the present application provides a compound represented by the following Chemical Formula 1.

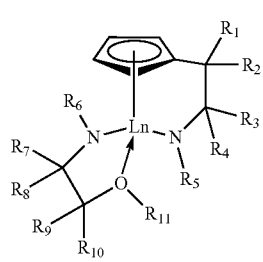

[Chemical Formula 1]

In Chemical Formula 1, Ln is a rare earth element, and $R_1$ to $R_{11}$ are each independently hydrogen, a substituted or unsubstituted, linear or branched, and saturated or unsaturated alkyl group having 1 to 6 carbon atoms, or an isomer thereof.

Another aspect of the present application provides a vapor deposition precursor including the compound.

Yet another aspect of the present application provides a method of manufacturing a thin film. The method includes introducing the vapor deposition precursor into a chamber.

The novel vapor-deposition-rare-earth compound and the precursor including the vapor deposition compound according to the present invention are excellent in thermal stability, which enables thin-film deposition at high temperatures. Since the amount of residual materials generated due to heat loss is small, it is possible to prevent side reactions from occurring during processing.

Further, the vapor deposition precursor of the present invention has a low viscosity and evaporation rate and thus enables uniform thin-film deposition, thereby ensuring excellent thin-film properties, thickness, and step coverage.

Such properties serve to provide a precursor suitable for atomic layer deposition and chemical vapor deposition, and contribute to excellent thin-film characteristics.

Hereinafter, embodiments and Examples of the present application will be described in detail so that those skilled in the art can easily practice. However, the present application may be embodied in many different forms and should not be construed as being limited to the embodiments and Examples set forth herein.

Hereinafter, embodiments and Examples of the present application will be described in detail. However, the present application is not limited to these embodiments, Examples, or drawings.

An aspect of the present application provides a compound represented by the following Chemical Formula 1.

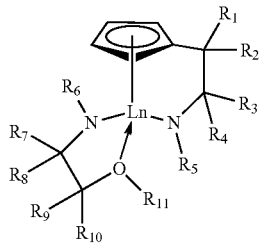

[Chemical Formula 1]

In Chemical Formula 1, Ln is a rare earth element, and $R_1$ to $R_{11}$ are each independently hydrogen, a substituted or unsubstituted, linear or branched, and saturated or unsaturated alkyl group having 1 to 6 carbon atoms, or an isomer thereof.

In an embodiment of the present application, preferably, each of $R_1$ to $R_{11}$ may be any one selected from the group consisting of hydrogen, a methyl group, an ethyl group, an n-propyl group, an iso-propyl group, an n-butyl group, an iso-butyl group, a sec-butyl group, a tert-butyl group, and an isomer thereof, but are not limited thereto.

In an embodiment of the present application, Ln may be any one among Sc (scandium), Y (yttrium), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu), but is not limited thereto.

In an embodiment of the present application, preferably, the compound represented by Chemical Formula 1 may be a compound represented by the following Chemical Formula 1-1.

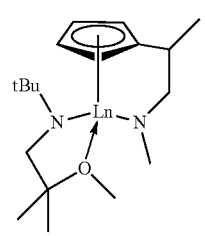

[Chemical Formula 1-1]

In Chemical Formula 1-1, Ln is lanthanum (La) or yttrium (Y), and tBu is tert-butyl.

Another aspect of the present application provides a deposition precursor, preferably a vapor deposition precursor, including the compound.

Yet another aspect of the present application provides a method of manufacturing a thin film. The method includes introducing the vapor deposition precursor into a chamber. The introducing the vapor deposition precursor into the chamber may include physical adsorption, chemical adsorption, or physical and chemical adsorption.

In an embodiment of the present application, the method of manufacturing the thin film may include atomic layer deposition (ALD) or chemical vapor deposition (CVD). The chemical vapor deposition may include metal organic chemical vapor deposition (MOCVD), low-pressure chemical vapor deposition (LPCVD), pulsed chemical vapor deposition (P-CVD), plasma-enhanced atomic layer deposition (PE-ALD), or a combination thereof, but is not limited thereto.

In an embodiment of the present application, the method of manufacturing the thin film may further include injecting one or more among an oxygen (O)-atom-containing compound, a nitrogen (N)-atom-containing compound, a carbon (C)-atom-containing compound, a silicon (Si)-atom-containing compound, and a germanium (Ge)-atom-containing compound as a reaction gas.

When the desired rare-earth-containing film contains oxygen, the reaction gas may be selected from among oxygen ($O_2$), ozone ($O_3$), water ($H_2O$), hydrogen peroxide ($H_2O_2$), and any combination thereof, but is not limited thereto.

When the desired rare-earth-containing film contains nitrogen, the reaction gas may be selected from among hydrogen ($H_2$), nitrogen ($N_2$), ammonia ($NH_3$), hydrazine ($N_2H_4$), and any combination thereof, but is not limited thereto.

When the desired rare-earth-containing film contains carbon, the reaction gas may be selected from among methane, ethane, propane, butane, ethylene, propylene, t-butylene, isobutylene, and any combination thereof, but is not limited thereto.

When the desired rare-earth-containing film contains silicon, the reaction gas may include a silicon source which is selected from among $SiH_4$, $Si_2H_6$, $Si_3H_8$, TriDMAS (tris(dimethylamino)silane, $SiH(N(CH_3)_2)_3$), BDMAS (bis(dimethylamino)silane, $SiH_2(N(CH_3)_2)_2$), BDEAS (bis(diethylamino)silane, $C_8H_{22}N_2Si$), TDEAS (tris(diethylamino)silane, $(Et_2N)_3SiH$), TEMAS (tetra[ethyl(methyl)amino]silane, $C_{12}H_{32}N_4Si$), $(SiH_3)_3N$, $(SiH_3)_2O$, trisilylamine, disiloxane, trisilylamine, disilane, trisilane, alkoxysilane, silanol, aminosilane, and any combination thereof, but is not limited thereto. Alternatively, a target film may contain germanium (Ge), in which case the above-mentioned Si-containing reactant species may be replaced by Ge-containing reactive species. The Ge-containing reactive species may include a germanium source which is selected from among $GeH_4$, $Ge_2H_6$, $Ge_3H_8$, $(GeH_3)_3N$, $(GeH_3)_2O$, and any combination thereof, but is not limited thereto.

Further, the desired rare-earth-containing film may include another metal.

Hereinafter, the present application will be described in more detail with reference to Examples, but is not limited thereto.

A ligand having a substituted cyclopentadienyl (Cp) skeleton may be combined with a ligand that is capable of imparting a chelating effect as in the synthesis reaction shown in the following Chemical Reaction Formula 1, thus manufacturing a novel rare earth precursor. An alkoxyamine ligand may be used as the ligand that is capable of imparting the chelating effect.

In more detail, after a rare earth compound ($LnX_3$) substituted with a halogen element (X) was reacted with a cyclopentadienyl (Cp) derivative ligand compound, an alkoxyamine-based ligand (1 equivalent) was introduced thereto, thus synthesizing a rare earth precursor.

[Chemical Reaction Formula 1]

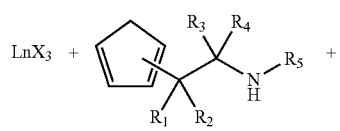

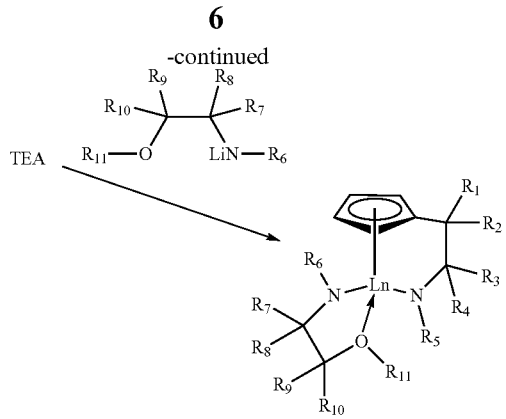

In Chemical Reaction Formula 1, Ln is a rare earth element, X is a halogen element, and $R_1$ to $R_{11}$ are each independently hydrogen, a substituted or unsubstituted, linear or branched, and saturated or unsaturated alkyl group having 1 to 6 carbon atoms, or an isomer thereof. The rare earth element is as described above.

Example 1

In order to perform the chemical reaction represented by the following Chemical Formula 2, $YCl_3$ (1 equivalent) was added to a flask and dissolved in an organic solvent. Then, a cyclopentadienyl (Cp) derivative ligand (1 equivalent) and triethylamine (TEA) (2 equivalents) were added thereto and agitated.

Then, a Li-substituted alkoxyamine-based ligand (1 equivalent) was added to the mixture and agitated overnight.

After completion of the reaction, the resultant mixture was filtered under reduced pressure, and a solvent was removed, followed by purification through distillation or sublimation, thus obtaining a final compound for pure yttrium(Y)-vapor-deposition precursors.

[Chemical Reaction Formula 2]

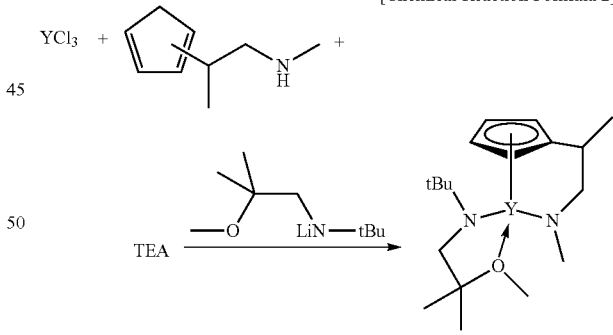

Example 2

A final compound for lanthanum(La)-vapor-deposition precursors was obtained using $LaCl_3$ instead of $YCl_3$ in Example 1.

Preparation Example 1

A rare earth thin film was deposited on a substrate by alternately applying the novel rare earth precursor synthesized in Example 1 of the present invention and a reactant $O_3$. The substrate used in the present experiment was a p-type Si wafer, and the resistance thereof was 0.02 Ω·cm. Prior to the deposition, the p-type Si wafer was cleaned by ultrasonication for 10 minutes in each of acetone, ethanol, and deionized water (DI water). The natural oxide thin film formed on the Si wafer was immersed in a 10% HF solution ($HF:H_2O=1:9$) for 10 seconds and then removed. The substrate was kept ready by being maintained at a temperature of 150 to 450° C. The novel solid rare earth precursor synthesized in Example 1 was evaporated in a bubbler maintained at a temperature of 90 to 150° C.

Argon (Ar) was supplied as a purge gas to purge the remaining precursor and the reaction gas in a deposition chamber. The flow rate of argon was set to 1000 sccm. Ozone ($O_3$) at a concentration of 224 $g/cm^3$ was used as the reaction gas. Each reaction gas was injected by adjusting the on/off of a pneumatic valve, and a film was formed at a process temperature.

An ALD cycle included the sequence of purging using argon for 10 seconds after precursor pulsing of 10/15 seconds and then additional purging using argon for 10 seconds after reactant pulsing of 2/5/8/10 seconds. The pressure in the deposition chamber was adjusted to 1 to 1.5 torr, and the deposition temperature was adjusted to 150 to 450° C.

The growth rate of the yttrium oxide thin film was observed to be 1.0 Å/cycle and a deposition thickness was about 200 Å.

Preparation Example 2

A lanthanum oxide thin film was deposited on a substrate under the same conditions as in Preparation Example 1, except that the novel rare earth precursor synthesized in Example 2 of the present invention was used. The growth rate of the lanthanum oxide thin film was observed to be 1.0 Å/cycle, and the thickness thereof was about 200 Å.

Preparation Example 3

The novel rare earth precursors synthesized in Examples 1 and 2 of the present invention were alternately applied, thus manufacturing multi-component coatings of yttrium oxide and lanthanum oxide. The rare earth precursors may be supported in each of two different bubblers connected to an evaporator to be alternately pulsed into a deposition chamber. The ALD conditions were the same as in Preparation Examples 1 and 2, and each oxide thin film was formed to a thickness of 4 to 10 Å. The number of multi-component coating layers that were obtained depended on the number of repetitions of each deposition process.

Preparation Example 4

The novel rare earth precursor synthesized in Example 1 of the present invention was used to manufacture a thin film containing a rare earth element according to a chemical vapor deposition process. A starting precursor solution was prepared, in which the precursor synthesized in Example 1 was contained at a concentration of 0.02M in octane. This starting precursor solution was delivered at a flow rate of 0.1 cc/min to an evaporator maintained at a temperature of 90 to 150° C. The evaporated precursor was delivered to a deposition chamber using helium carrier gas at 50 to 300 sccm. Hydrogen ($H_2$) and oxygen ($O_2$) were used as the reaction gas and were each supplied to the deposition chamber at a flow rate of 0.5 L/min (0.5 pm). The pressure in the deposition chamber was adjusted to 1 to 15 torr, and the deposition temperature was adjusted to 150 to 450° C. Under these conditions, a deposition process was performed for about 15 minutes.

A rare-earth-containing precursor and one or more reaction gases may be simultaneously introduced into a reaction chamber using chemical vapor deposition, atomic layer deposition, or other combinations.

For example, the rare-earth-containing precursor may be introduced using a single pulse, and two additional metal sources may be introduced together using separate pulses. Further, the reaction chamber may contain reactant species in advance, prior to introduction of the rare-earth-containing precursor.

The reactant gas may pass through a plasma system located far from the reaction chamber to be decomposed into radicals. Further, another metal source may be introduced using a pulse, and subsequently, the rare-earth-containing precursor may be introduced into the reaction chamber.

For example, in an atomic-layer-deposition-type process, a vaporous rare-earth-containing precursor is introduced into the reaction chamber and comes into contact with a suitable substrate therein. Thereafter, an excess of the rare-earth-containing precursor may be removed from the reaction chamber by purging a reactor.

An oxygen source is introduced to the reaction chamber and reacts with the rare earth precursor absorbed in a self-limiting manner therein. An excess of the oxygen source may be removed from the reaction chamber by purging and/or degassing the reaction chamber. When the desired film is a rare-earth-oxide film, the process may be repeated until the desired film thickness is obtained.

It was confirmed that the rare earth precursor of Example 1 or 2, newly synthesized through the above-described manufacture of the thin film, overcomes the problems with thin-film deposition of conventional rare earth precursors, is capable of being applied to ALD as well as CVD, and has excellent volatility and thermal stability and a low melting point.

Further, it is possible to perform uniform thin-film deposition using the novel rare earth precursor, thereby ensuring excellent thin-film properties, thickness, and step coverage.

The scope of the present invention is represented by the claims that follow, rather than the above detailed description, and all changes or modifications derived from the meaning and scope of the claims and their equivalents should be construed as being included in the scope of the present invention.

The novel vapor-deposition-rare-earth compound and the precursor including the vapor deposition compound according to the present invention exhibit excellent thermal stability, which enables thin-film deposition at high temperatures. Since the amount of residual materials generated due to heat loss is small, it is possible to prevent side reactions from occurring during processing. Further, the vapor deposition precursor of the present invention has a low viscosity and evaporation rate and thus enables uniform thin-film deposition, thereby ensuring excellent thin-film properties, thickness, and step coverage. Such properties serve to provide a precursor suitable for atomic layer deposition and chemical vapor deposition, and contribute to excellent thin-film characteristics.

Therefore, it is possible to effectively manufacture a thin film for semiconductors according to an atomic layer deposition process and a chemical vapor deposition process using the novel vapor-deposition-rare-earth compound of the present invention and a precursor including a vapor deposition compound containing the same.

The invention claimed is:

1. A compound represented by Chemical Formula 1 below:

[Chemical Formula 1]

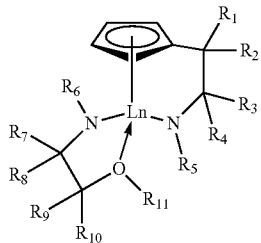

in Chemical Formula 1,
Ln is a rare earth element, and
$R_1$ to $R_{11}$ are each independently hydrogen, a substituted or unsubstituted, linear or branched, and saturated or unsaturated alkyl group having 1 to 6 carbon atoms, or an isomer thereof.

2. The compound of claim 1, wherein $R_1$ to $R_{11}$ are each any one selected from the group consisting of hydrogen, a methyl group, an ethyl group, an n-propyl group, an iso-propyl group, an n-butyl group, an iso-butyl group, a sec-butyl group, a tert-butyl group, and an isomer thereof.

3. The compound of claim 1, wherein Ln is any one among Sc (scandium), Y (yttrium), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

4. The compound of claim 1, wherein the compound represented by the Chemical Formula 1 is represented by Chemical Formula 1-1 below:

[Chemical Formula 1-1]

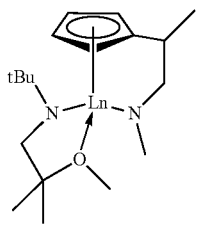

in Chemical Formula 1-1,
Ln is lanthanum (La) or yttrium (Y), and
tBu is tert-butyl.

5. A vapor deposition precursor comprising the compound of claim 1.

6. A method of manufacturing a thin film, the method comprising:
introducing the vapor deposition precursor of claim 5 into a chamber.

7. The method of claim 6, wherein the method of manufacturing the thin film includes atomic layer deposition (ALD) or chemical vapor deposition (CVD).

8. The method of claim 6, further comprising injecting at least one among an oxygen (O)-atom-containing compound, a nitrogen (N)-atom-containing compound, a carbon (C)-atom-containing compound, and a silicon (Si)-atom-containing compound as a reaction gas.

9. The method of claim 8, wherein the reaction gas is at least one selected from among hydrogen ($H_2$), oxygen ($O_2$), ozone ($O_3$), water ($H_2O$), hydrogen peroxide ($H_2O_2$), nitrogen ($N_2$), ammonia ($NH_3$), hydrazine ($N_2H_4$), methane, ethane, propane, butane, ethylene, propylene, t-butylene, isobutylene, silane, $SiH_4$, $Si_2H_6$, $Si_3H_8$, tris(dimethylamino)silane, bis(dimethylamino)silane, bis(diethylamino)silane, tris(diethylamino)silane, tetra[ethyl(methyl)amino]silane, $(SiH_3)_3N$, $(SiH_3)_2O$, $GeH_4$, $Ge_2H_6$, $Ge_3H_8$, $(GeH_3)_3N$, $(GeH_3)_2O$, trisilyamine, disiloxane, trisilylamine, disilane, trisilane, alkoxysilane, silanol, and aminosilane.

* * * * *